United States Patent

Umbaugh

[15] 3,697,837

[45] Oct. 10, 1972

[54] ELECTROMAGNETIC FORCE SYSTEM FOR INTEGRATED CIRCUIT FABRICATION

[72] Inventor: Charles Wayne Umbaugh, Phoenix, Ariz.

[73] Assignee: General Electric Company

[22] Filed: Oct. 5, 1970

[21] Appl. No.: 78,039

[52] U.S. Cl. ........................318/128, 310/16, 310/30

[51] Int. Cl. ..............................................H02k 33/14

[58] Field of Search ......310/30, 34, 35, 16; 318/119, 318/127, 128, 130, 132, 134

[56] References Cited

UNITED STATES PATENTS 3,470,432 9/1969 Chubbuck .................318/127

*Primary Examiner*—D. F. Duggan

*Attorney*—Edward W. Hughes, Calvin E. Thorpe, James A. Pershon, Frank L. Neuhauser, Oscar B. Waddell and Joseph B. Forman

[57] ABSTRACT

A feedback controlled spacial-force mechanism is used with a variety of tools for integrated circuit fabrication. The mechanism utilizes a force producing element having a force which may be held constant over a practical range of displacement.

6 Claims, 6 Drawing Figures

INVENTOR.
CHARLES WAYNE UMBAUGH

TOOL DISPLACEMENT VS FORCE

ELECTROMAGNETIC FORCE SYSTEM FOR INTEGRATED CIRCUIT FABRICATION

BACKGROUND OF THE INVENTION

1. Field Of The Invention

This invention relates generally to integrated circuit fabrication, and more particularly to the bonding and interconnection of functional components in which an electromagnetic force system is used either as a holding force or as a precisely controlled force utilized to effect a bond.

2. Description Of The Prior Art

The emergence of solid state integrated circuit electronic devices has led to the development of many techniques for joining metal leads to metallized semiconductor surfaces to effect the interconnection of devices. Among these techniques are thermocompression bonding, including ball and wedge bonding, which employ precisely controlled heat and pressure to effect a plastic deformation and diffusion of material over a controlled time period. Other joining techniques include ultrasonic bonding, parallel gap soldering and welding, laser welding, thermal pulse bonding, as well as forge welding, cladding, and pressure welding. With the advent of simultaneous multiple bonding of a large number of terminals or interconnections such as those techniques well known in the art, including beam lead, flip-chip, encapsulated lead frame, and other decal type joining processes, the spacing between leads has decreased substantially and consideration of precise tolerances and control of the bond parameters has become increasingly important. Many of the methods of precision welding and bonding require that a precise force be applied to the bonding element, the force being either a clamping force which holds the pieces together prior to and during the bonding cycle, or a force which is itself a parameter of the bonding technique or method. Different bonding techniques demand different explicit benefits from the clamping action or the force parameter in the bonding process, but the generalized common factor is improved and precisely controlled contact in the bonding area.

A full command of the tool force, either fixed or variable, throughout the entire bonding cycle is desirable. As force control is improved, the bond quality and reproducibility improve. These benefits are desirable in any situation, but they are very important in process development situations where a wide variety of force schedules coupled with other programmable parameters must be evaluated.

Many force producing mechanisms in prior art bonding and welding apparatus have been of a purely mechanical nature, generating a single predetermined force by means of adjustable springs or weights. Other prior art force systems have employed variable force programs augmented by a feedback signal to regulate the force. Such systems are massive, however, relative to the integrated circuit art, there being a degradation of precise control as tool displacement increases.

SUMMARY OF THE INVENTION

In the preferred embodiment of my invention there is provided a spatial-force control mechanism, providing stability through feedback control which is independent of tool displacement.

Many types of welding tips and other tools may be used in combination with the force control system. The rate of travel of the force system support, the tool force, the tool displacement, and the tool power (i.e., the thermal, vibratory, or other energy component supplied to the tool) are all variable and mutually programmable with respect to time. Either by changing tools or utilizing the same tool attached to the tool mounting plate, work pieces may be cold forged prior to bonding, bonded with increasing or decreasing force during nugget formation, or forge-control bonded in a programmed and highly repeatable manner.

It is, therefore, an object of my invention to provide an enhanced electromagnetic force system.

It is a further object of my invention to provide a force system for integrated circuit fabrication.

Another object of my invention is to provide an enhanced electromagnetic force system with feedback control usable with a variety of tools to effect the bonding, inter-connection, and packaging of integrated circuits.

Another object of my invention is to provide a precisely controlled electromagnetic force-producing element for integrated circuit fabrication having a high tolerance to relative movement between the core and the coil of the electromagnetic element.

The manner in which these and other objects of my invention are achieved will become more readily apparent to those skilled in the art by referring to the following description and embodiments taken in conjunction with the accompanying claims and drawings.

DESCRIPTION OF THE PREFERRED EMBODIMENT

Figure 1:
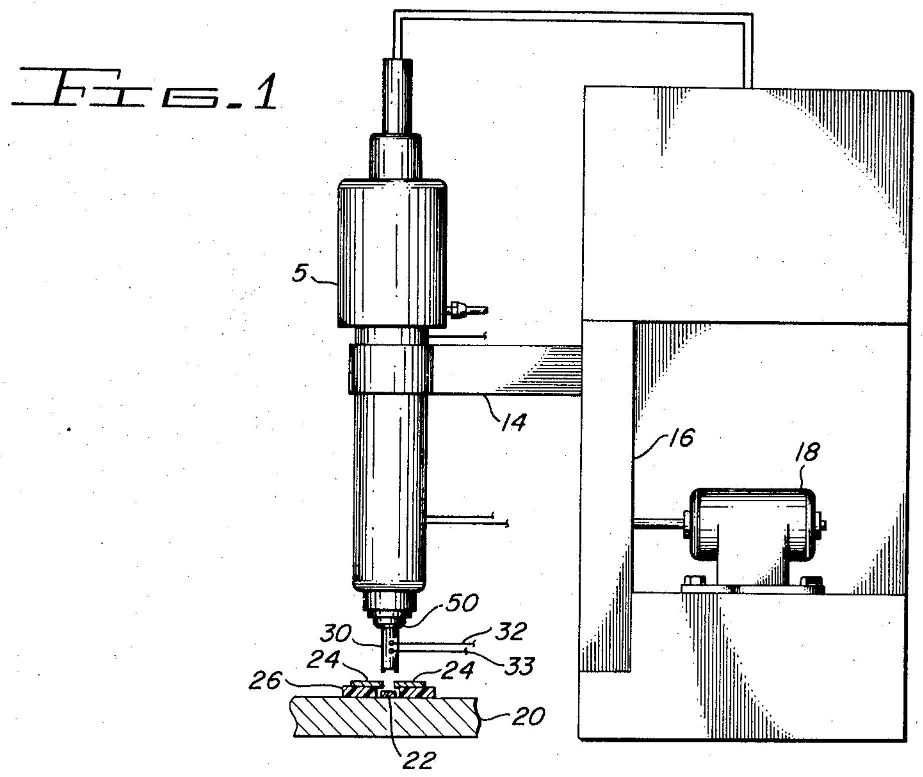
FIG. 1 shows an integrated circuit bonding apparatus utilizing the force head assembly of the present invention.

FIG. 1 shows a bonding mechanism arranged for integrated circuit fabrication. An electromagnetic force head assembly 5 is attached to a force head support 14. The force head support 14 is linked through a conventional travel mechanism 16 to a driving means shown as an electric motor 18. The motor 18 provides a driving force through the travel mechanism 16 for vertical movement of the force head assembly 5 toward or away from a work surface 20. A bonding tool 30 is attached to a tool mounting plate 50. The bonding tool 30 is shown disposed directly above a work piece comprising an integrated circuit chip 22 which is to be bonded to interconnecting elements 24 on a substrate 26. The substrate 26 may contain other integrated circuit elements. The bonding tool 30 is shown in FIG. 1 as a resistance type heating element. Electrical current for heating the heating element may be supplied through conductors 32 and 33 from a suitable power supply not shown.

Figure 2:
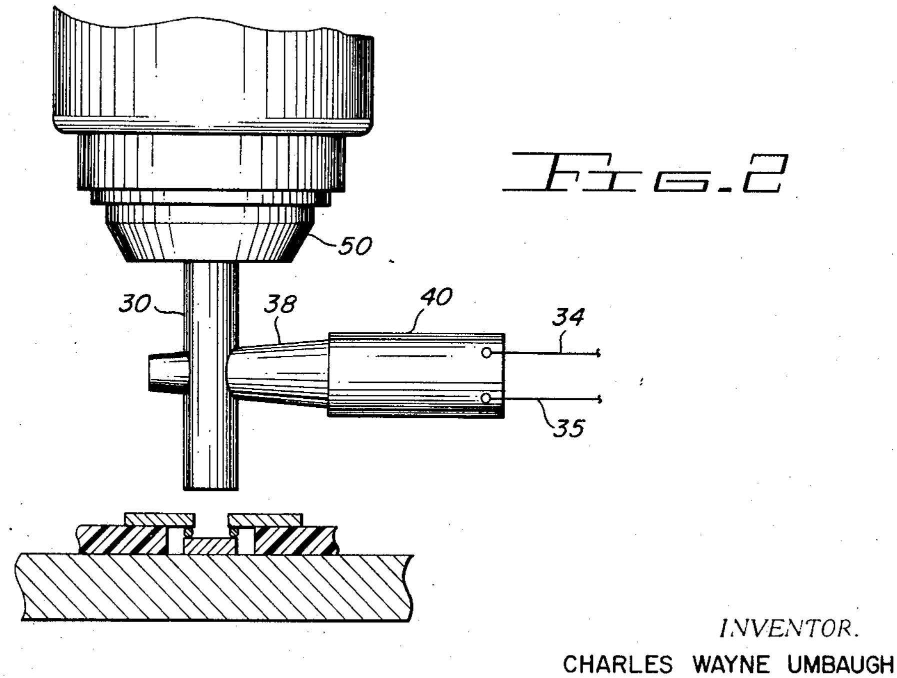
FIG. 2 is a diagram of an ultrasonic bonding tip that may be used with the electromagnetic force system of my invention.

FIG. 2 shows an alternate embodiment wherein the bonding tool 30 attached to the tool mounting plate 50 of the force head assembly 5 is an ultrasonic bonding apparatus. Ultrasonic energy is applied to the bonding tool 30 from an ultrasonic bonder power supply (not shown) through conductors 34 and 35, an ultrasonic transducer 40, and a horn 38. Other types of bonding tools can be used, the only criteria being the energy supplied by the tool to the work piece.

Figure 3:
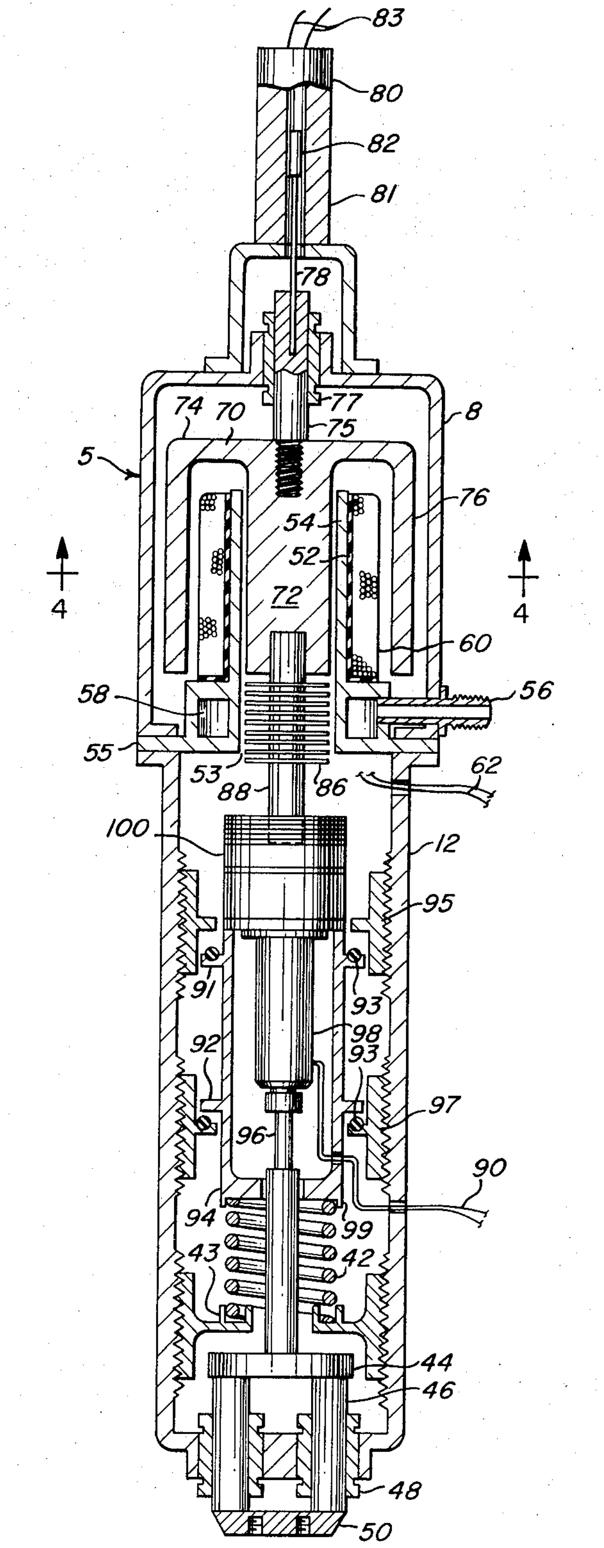
FIG. 3 is a sectional view of an apparatus according to my invention which shows the electromagnetic force head assembly.
Figure 6:
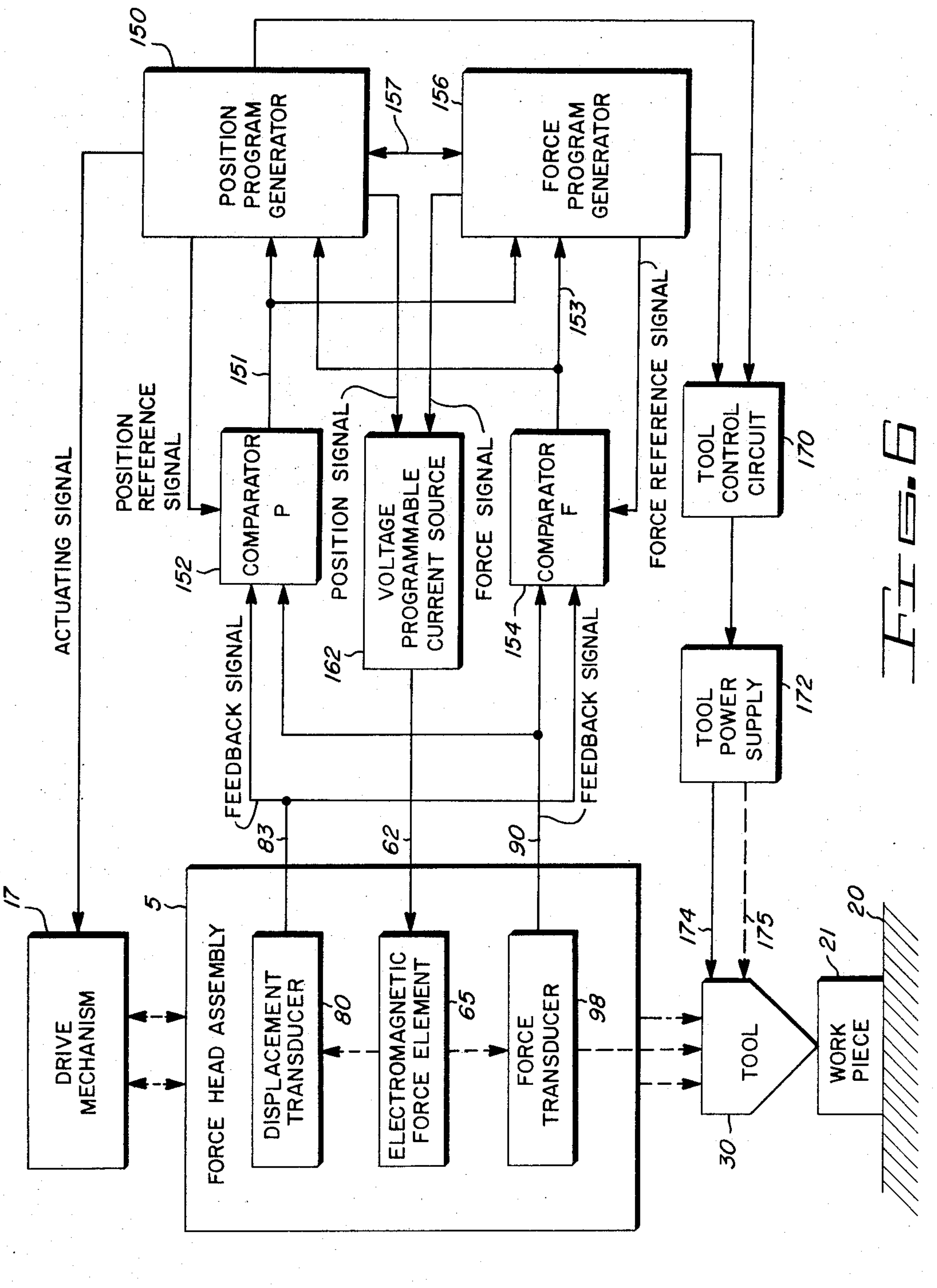
FIG. 6 is a block diagram of the control system.

FIG. 3 is a section view of the force head assembly 5 of FIG. 1. The force head assembly 5 includes an upper housing 8 and a lower housing 12. Attached to the upper housing 8 is a base member 55 having a central aperture 53 and an extension 54. Formed within the base member 55 is an annular chamber 58 through which a cooling fluid which may be water is circulated. A water fitting 56 provides entry to the annular chamber 58 for the cooling water from an external source, not shown. A second water fitting (not shown) is provided as an exhaust port for the circulating cooling water. A generally toroidal shaped field producing coil 60 having lead-in wires 62 for carrying electric current is attached to but electrically insulated from the base member 55. The leadin wires 62 pass through an aperture in the lower housing 12 and connect to a suitable source of electric current, as for example, a voltage programmable current source 162 (FIG. 6). Concentric with the fixed coil 60 and disposed around it is a movable, folded, cup-shaped iron core 70 comprising a central member 72, a closed end 74, and a sidewall 76. The folded core 70 comprises the driven element of the electromagnetic force system. Attached to the folded core 70 are components of the centrally disposed axial member of the force head assembly.

Figure 4:
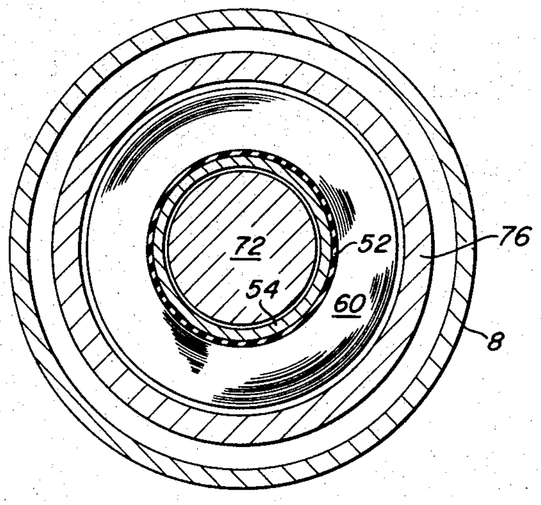
FIG. 4 is a section on line 4—4 of FIG. 3, showing the arrangement of the field coil and the folded iron core.

FIG. 4 is section view taken along lines 4—4 of FIG. 3 and shows the arrangement of the various components comprising the force element within the upper housing 8 of the force head assembly 5. The folded iron core which includes the sidewall 76 and the central member 72 is shown disposed concentrically about the coil 60. The toroidal shaped coil 60 is shown wound about the base member extension 54 and separated from it by a layer of electrical insulation 52. The electrical insulation 52 may be any suitable material having high thermal conductivity, such as filled epoxy resin. The base member extension 54 is preferably a nonmagnetic material having high thermal conductivity for rapidly dissipating the heat generated by the coil 60 into the cooling water circulating within the annular chamber 58 (FIG. 3) formed in the base member.

Returning to FIG. 3, there is shown a displacement transducer assembly 80 having a fixed portion 81 attached to the upper housing 8 and movable displacement sensor 82. Wires 83 which carry voltage signals representative of the analog of the displacement sensed by the sensor 82 issue from the transducer assembly 80. The movable sensor 82 is attached by a shaft 78 and an extension 75 to the closed end 74 of the folded iron core 70. The extension 75 slides through a ball bushing 77 attached to the upper housing 8.

A load cell 100 is attached to the lower end of the central member 72 of the core 70 via a rod connector 88. The rod connector 88 is surrounded by a finned heat sink 86 which is positioned axially so as to be adjacent to and surrounded by the annular cooling water chamber 58. The cooling water circulating in the annular chamber 58 absorbs heat by conduction from the field producing coil 60, the primary generator of heat, but also serves to absorb radiant heat from the heat sink 86 which is in thermal contact with the folded core 70. Thus the ambient temperature of the electromagnetic force element is maintained at a constant level by the rapid circulation of cooling water, and variations of force as a function of thermal change are eliminated.

The load cell 100 includes a force transducer 98, and a transducer housing 94. Extending outward from the housing 94 are an upper flange 91 and a lower flange 92. Flanges 91 and 92 are movable with the axial member and cooperate with fixed annular flanges 95 and 97 which are attached to and protrude from the inner surface of the lower housing 12. The flanges extend inward toward the central axis of the force head assembly. The flanges 95 and 97 are fixed during operation of the force head assembly, but are threaded for adjustment. Fixed flange 95 cooperates with movable flange 91 on the transducer housing 94 to form an upper stop which limits the upward movement of the axial member of the force head assembly. Fixed flange 97 cooperates with flange 92 on the transducer housing to form a lower or preload stop which limits the downward movement of the axial member. O-rings 93 are provided as snubbers.

Wires 90 carry voltage signals representative of the force sensed by the force transducer 98 and pass through suitable apertures in the transducer housing 94 and the lower force head housing 12. A shaft 96 is attached at one end to the transducer 98, and extends downward therefrom through an opening in the transducer housing 94. The opposite end of the shaft 96 is attached to a crossbar 44.

The shaft 96 is coaxial with and passes through a spring 42. The spring 42 is disposed between a spring seat 99 formed in the lower end of the transducer housing 94 and an adjustable spring guide 43. The spring guide 43 is threaded to the lower housing 12. The shaft 96 passes through a central aperture in the spring guide 43. Below the spring guide 43 is the crossbar 44 to which the shaft 96 is attached. Attached to the crossbar 44 are a pair of cylindrical shaft tip guides 46 which pass slideably through bushings 48 at the lower end of the lower housing 12. The tool mounting plate 50 is securely attached to the shaft tip guides 46.

The force developed by the electromagnetic core assembly is thus propagated directly through the force transducer 98 via the shaft 96 and the shaft tip guides 46, to the tool which is securely attached to the tool mounting plate 50. Displacement in the force transducer 98 is negligible. Electrical conductors pass through suitable apertures in the lower housing 12 and the transducer housing 94 and connect the force transducer 98 to the feedback system. Electrical wires connect the displacement transducer assembly 80 to the force system feedback network. Wires 62 carry the electrical current for producing an electromagnetic field in the coil 60.

The force element in the force head assembly 5 comprises the movable folded iron core 70 driven by the fixed field producing coil 60. The folded iron core 70 achieves dispersion of the magnetization which opposes the desirable force producing magnetization by presenting a low reluctance path at its closed end 74, where the change in flux density is highest. The result is a force producing element of medium strength (in the range of 0 to 15 pounds) which force is relatively independent of displacement between the core 70 and the coil 60. The force produced is characterized by the following equation:

$$\text{Force } F \alpha \frac{B_s A(NI)l}{(4R^2+l^2)^{1/2}\, 2(l-x)} \text{ for } 0 \leq x \leq \frac{1}{2}$$

Where in the MKS system:

$F$ = force in newtons, $B_s$ = flux density of the saturated core, $NI$ = ampere turns in the coil, $l$ = length of the coil, $R$ = radius of the coil, $A$ = cross sectional area of the core, and $x$ = displacement of the core from the fully inserted position.

Figure 5:
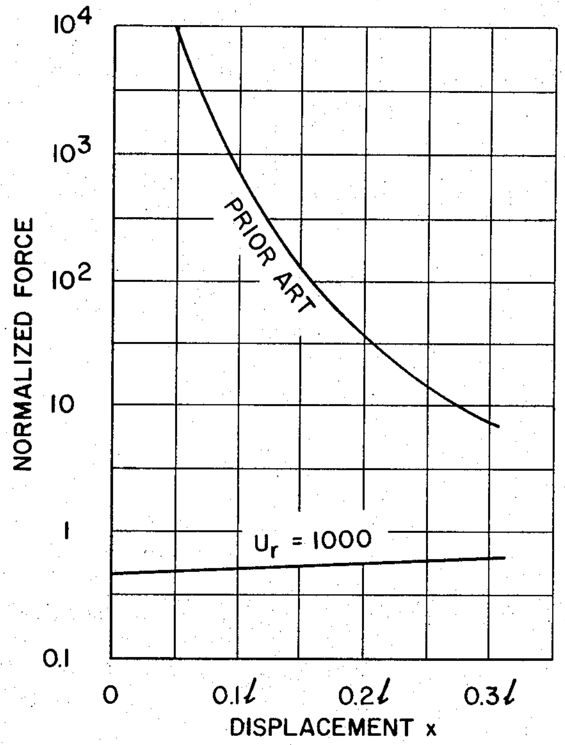
FIG. 5 is a graph of tool displacement versus force comparing my invention with the prior art.

FIG. 5 shows graphically the advantage achieved by my invention over the prior art electromagnetic force producing systems. The force produced by the prior art systems is characterized generally by the following equation:

$$\text{Force } F \alpha \frac{U_0(NI)^2}{4\pi x^2[(l-x)+U_r x]^2} \text{ for } 0 \leq x \leq \frac{1}{2}$$

Where the symbols are the same as previously mentioned, except:

$U_o$ = permeability of air, and $U_r$ = relative permeability of iron core.

FIG. 5 illustrates the stability of my invention by showing tool displacement plotted versus force. Displacement is indicated along the abscissa as increments of the length of the coil. The coil described in the preferred embodiment of my invention has a length of approximately 2 inches. A practical range of displacement is about one-half inch or from 0 to 0.25 $L$, where $l$ = the length of the coil.

Normalized force is indicated along the ordinate of the graph. The normalization factor is arbitrary and is chosen only for convenience. The force normalization factor is the function F($x$) evaluated at $x$ = ½ or $$F_{\text{normalized}} = \frac{F(x)}{F(x)}\ x = \frac{1}{2}$$

The lower curve of FIG. 5 represents displacement versus force for the preferred embodiment of the force element of my invention. A core with a permeability $U_r$ of 1,000 was selected. Over the normalized force variation in my core is negligible, being less than 0.2. Over the same range, the force versus displacement curve representative of the prior art varies in normalized force (as the displacement decreases) more than three orders of magnitude, from approximately 12 to more than $10^4$.

FIG. 6 is a schematic block diagram of the closed loop feedback control system of my invention. The elements shown in block form to the right of the force head assembly 5 are conventional electrical and electronic circuits. For example, block 150 labeled Position Program Generator may be numerical control apparatus or the like employing digital logic circuits, electromechanical apparatus or a combination thereof. It is the manner in which the aforementioned elements cooperate with the force head assembly 5 and the tool 30 that forms a novel feature of my invention and not in the individual circuit elements used.

Referring now to FIG. 9, the force head assembly 5, with an appropriate bonding tip or tool 30 attached is moved toward a work piece 21 on work surface 20 by the drive mechanism, shown as block 17, in response to an actuating signal from a position program generator 150. When the tool contacts the work piece, a signal from the displacement transducer 80 is transferred by wires 83 to a comparator 152. An error signal is developed in the comparator 152 by comparing the feedback signal from the displacement transducer, with a position reference signal from the position program generator 150. The error signal is transferred to the position program generator 150 via lead 151. The position program generator may, in response to the error signal from the comparator 152, disable the actuating signal for the drive mechanism 17. In response to an error signal from comparator 152, the position program generator 150 may also initiate a force program by signaling the force program generator 156 via line 157.

The force program generator 156 transmits a force signal to the voltage programmable current source 162 which actuates the electromagnetic force element 65 by supplying current through wires 62 at a time predetermined either by the position program or the force program. A signal is generated at the appropriate time by either the position program generator or the force program generator and transferred to the tool control circuit 170, which in turn actuates the tool power supply 172. The tool power supply transmits energy to the tool 30 via lines 174 and 175. Line 174 represents a path for electrical or thermal energy; line 175, a path for vibratory or mechanical energy. The force applied to the tool by the electromagnetic force element 65 (propogated through the force transducer 98) is sensed by the force transducer and a feedback signal is transferred to comparator 154 via wires 90. The voltage analog signal of the force transducer 98 is compared in the comparator 154 with a force reference signal from the force program generator 156. The resultant signal is transferred to the force program generator via line 153. Minute displacement of the tool caused by work piece deformation is sensed by displacement transducer 80 and a feedback signal from the transducer 80 is transferred via line 83 to both comparators 152 and 154.

At this time, the complete duality of the system according to my invention should be pointed out. The feedback signals from each of the transducers 80 and 98 are transferred to both the position comparator 152 and the force comparator 154. The outputs of comparators 152 and 154 are transferred to both the position program generator and the force program generator. The position program generator and the force program generator exchange control signals via line 157. The output of the voltage programmable current source 162 may be enabled, changed, or disabled by either a position signal or a force signal. The output of the tool control circuit 170 may be enabled, changed, or disabled by signals from either the position program generator 150 or the force program generator 156. The drive mechanism 17 responds to an actuating signal from the position program generator 150, which in turn may receive its stimulus from the position comparator 152, the force comparator 154, or the force program generator 156. Thus, an infinite variety of force, position, and tool energy programs may be achieved with my invention.

A typical example of a program utilizing the preferred embodiment of my invention can be described by referring to FIG. 6 in conjunction with FIG. 3. After attaching an appropriate tool 30 to the tool mounting plate 50, see FIG. 3, the spring guide 43 is adjusted to balance the weight of the axial member against the force of the spring 42. The preload stop 97 is then adjusted until the O ring 93 comes into contact with the flange 92 on the transducer housing 94. The upper flange 91 is then adjusted to allow for approximately 0.250 inch total axial member travel. Assuming that a preloaded force schedule is desired, see FIG. 6, an appropriate force signal is transmitted to the voltage programmable current source 162 from the force program generator 156 to yield the desired force as indicated by the output of the force transducer 98, compared with a force reference signal in the force comparator 154. The mechanical drive mechanism is activated in response to a stimulus from the force program generator to lower the entire head assembly. As the tool 30 contacts the work piece 21, the axial member of the force head assembly is displaced and the displacement is sensed by the transducer 80. The displacement transducer feedback signal sensed either by comparator 152 or 154 may provide the stimulus for stopping the mechanical drive mechanism. The tool control circuit 170 is then energized in response to a signal from the force program generator. The tool power supply 172 is enabled by the tool control circuit 170 either at a predetermined time in accordance with the force program or in response to the feedback signal from the displacement transducer. As the program is executed, the minute tool displacement resulting from work piece deformation is monitored dynamically by the displacement transducer 80. When the appropriate work piece deformation is sensed, the tool power supply 172 is deactivated and the actuating signal to the drive mechanism 17 is enabled to raise the tool 30 and the force head assembly 5 away from the work piece.

While the principles of my invention have now been made clear in the foregoing illustrative embodiments, there will be immediately obvious to those skilled in the art many modifications of structure, arrangement, proportions, the elements, material and components used in the practice of the invention, and otherwise, which are particularly adapted for specific environments and operating requirements without departing from those principles. The appended claims are, therefore, intended to cover and embrace any such modifications, within the limits only of the true spirit and scope of my invention.

What is claimed is:

1. An electromagnetic force system with feedback control for fabricating integrated circuits, comprising:

a coil for producing an electromagnetic field;

means for supplying electrical current to the coil;

an axially movable force producing member including 1. a folded iron core,
2. a displacement transducer attached to the core,
3. a force transducer attached to the core;

a tool attached to the axially movable force producing member; and means for varying the current supplied to the coil in response to output signals from the displacement and force transducers to control the force applied to the tool.

2. An electromagnetic force system as described in claim 1 further comprising means for maintaining the force system at a selected temperature.

3. An electromagnetic force system as described in claim 2 wherein the means for maintaining the force system at a selected temperature comprises;

a base member around which the coil is wound, said base member having a chamber through which a cooling fluid is circulated; and a heat sink in thermal contact with the core and adjacent to the base member.

4. An electromagnetic force system with feedback control for fabricating integrated circuits, comprising:

a movable, force-producing iron core having a generally cup-shaped form with a closed end and a generally cylindrical sidewall, said core including a central member extending from the closed end;

a fixed, generally toroidal shaped coil for generating a magnetic field in response to an electric current, said coil disposed within said core and encircling said central member;

means for maintaining said coil and said core at a selected temperature;

a displacement transducer coaxial with the central member of said core and attached to the closed end of said core, said displacement transducer generating an output signal representative of the displacement of the core;

a force transducer attached to and coaxial with the central member of said core, said force transducer generating an output signal representative of the force produced by said core;

a tool coaxial with and attached to said force transducer; and means for varying the electric current supplied to said coil in response to the output signals from said displacement and force transducers, to control the force applied to said tool.

5. An electromagnetic force system as defined in claim 4 further comprising means for supplying vibratory energy to said tool.

6. An electromagnetic force system as described in claim 4 wherein the means for maintaining said coil and said core at a selected temperature comprises:

a base member around which the coil is wound, said base member having a chamber through which a cooling fluid is circulated; and a heat sink in thermal contact with the core and adjacent to the base member.

* * * * *